United States Patent
Tseng et al.

(10) Patent No.: US 10,193,569 B2
(45) Date of Patent: Jan. 29, 2019

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventors: Chien-Fu Tseng, Yunlin County (TW); Tsai-Cheng Lin, Hsinchu (TW); Yen-Chiao Lai, Changhua County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 166 days.

(21) Appl. No.: 14/477,867

(22) Filed: Sep. 5, 2014

(65) Prior Publication Data

US 2016/0020784 A1 Jan. 21, 2016

(30) Foreign Application Priority Data

Jul. 16, 2014 (TW) .............................. 103124424 A

(51) Int. Cl.
*H03M 13/11* (2006.01)
*H04L 1/00* (2006.01)
(Continued)

(52) U.S. Cl.
CPC ....... *H03M 13/1128* (2013.01); *G06F 11/076* (2013.01); *H03M 13/255* (2013.01);
(Continued)

(58) Field of Classification Search
CPC ......... H03M 13/2948; H03M 13/3746; H03M 13/3707; H03M 13/255; H03M 13/1128;
(Continued)

(56) References Cited

U.S. PATENT DOCUMENTS 4,677,622 A * 6/1987 Okamoto ........... G11B 20/1809
714/756
6,763,076 B1 * 7/2004 Glavieux ................ H04L 1/005
375/232

(Continued)

FOREIGN PATENT DOCUMENTS

CN 102468857 5/2012
CN 101777921 4/2013

OTHER PUBLICATIONS

"Office Action of Taiwan Counterpart Application," dated Apr. 18, 2016, p. 1-p. 5, in which the listed references were cited.

*Primary Examiner* — April Y Blair
*Assistant Examiner* — Sazzad Hossain
(74) *Attorney, Agent, or Firm* — JCIPRNET

(57) ABSTRACT

A decoding method, a memory storage device and a memory control circuit unit are provided. The decoding method includes: executing at least one first iteration decoding procedure of an LDPC on a first codeword according to a first clock signal by a correcting circuit; generating a control parameter according to a first iteration count of the first iteration decoding procedure; outputting a second clock signal to the correcting circuit according to the control parameter; and executing at least one second iteration decoding procedure of the LDPC on a second codeword according to the second clock signal by the correcting circuit.

15 Claims, 14 Drawing Sheets

(51) Int. Cl.
*H03M 13/25* (2006.01)
*G06F 11/07* (2006.01)
*H03M 13/37* (2006.01)
*H03M 13/29* (2006.01)

(52) U.S. Cl.
CPC .... *H03M 13/2948* (2013.01); *H03M 13/3707* (2013.01); *H03M 13/3746* (2013.01); *H03M 13/3753* (2013.01); *H04L 1/005* (2013.01)

(58) Field of Classification Search
CPC ... H03M 13/3753; H04L 1/005; G06F 11/076
USPC .................................. 714/704, 752, 755
See application file for complete search history.

(56) References Cited

U.S. PATENT DOCUMENTS

| | | | | |
|---|---|---|---|---|
| 7,380,197 | B1 * | 5/2008 | Goolsby | H03M 13/03 |
| | | | | 714/758 |
| 8,839,051 | B1 * | 9/2014 | Yeung | G06F 11/10 |
| | | | | 714/54 |
| 2002/0099985 | A1 * | 7/2002 | Cheng | H04L 1/0051 |
| | | | | 714/704 |
| 2008/0235561 | A1 * | 9/2008 | Yang | H04L 1/0057 |
| | | | | 714/801 |
| 2013/0179754 | A1 * | 7/2013 | Cherubini | G06F 11/1068 |
| | | | | 714/773 |
| 2014/0040530 | A1 * | 2/2014 | Chen | G06F 11/1068 |
| | | | | 711/103 |
| 2014/0082455 | A1 * | 3/2014 | Yosoku | G06F 11/10 |
| | | | | 714/763 |

\* cited by examiner

ND MEMORY CONTROL
DECODING METHOD, MEMORY STORAGE DEVICE AND MEMORY CONTROL CIRCUIT UNIT

CROSS-REFERENCE TO RELATED APPLICATION

This application claims the priority benefit of Taiwan application Ser. No. 103124424, filed on Jul. 16, 2014. The entirety of the above-mentioned patent application is hereby incorporated by reference herein and made a part of this specification.

BACKGROUND

Technology Field

The present invention relates a decoding method and more particularly, to a decoding method, a memory storage device and a memory control circuit unit.

Description of Related Art

The markets of digital cameras, cellular phones, and MP3 players have expanded rapidly in recent years, resulting in escalated demand for storage media by consumers. Due to having characteristics, such as data non-volatility, low power consumption, compact size and no mechanical structure, a rewritable non-volatile memory module (e.g., a flash memory) is suitable for being built in the aforementioned portable multi-media devices listed for example.

Generally speaking, an error checking and correcting circuit is disposed in a memory storage device. A frequency of a clock signal for driving the error checking and correcting circuit is fixed, and even a level thereof is quite high, so as to prevent system performance from being affected due to a decoding speed being too low. However, for a memory storage device having a limited throughput, it would be electricity wasting if providing a clock signal with quite high frequency to the error checking and correcting circuit, but brings no help in the overall speed for the memory storage device accessing data.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a decoding method, a memory storage device and a memory control circuit unit capable of dynamically adjusting a frequency of a clock signal currently used by a correcting circuit in charge of iteration decoding according to historic iteration counts.

According to an exemplary embodiment of the present invention, a decoding method for a memory control circuit unit is provided. The decoding method includes: executing at least one first iteration decoding procedure of a low density parity code (LDPC) on a first codeword according to a first clock signal by a correcting circuit; generating a control parameter according to a first iteration count of the at least one first iteration decoding procedure; outputting a second clock signal to the correcting circuit according to the control parameter; and executing at least one second iteration decoding procedure of the LDPC on a second codeword according to the second clock signal by the correcting circuit.

According to an exemplary embodiment of the present invention, a memory storage device including a connection interface unit, a rewritable non-volatile memory module and a memory control circuit unit is provided. The connection interface unit is configured to be coupled to a host system. The rewritable non-volatile memory module includes a plurality of physical erasing units. The memory control circuit unit is coupled with the connection interface unit and the rewritable non-volatile memory module. The memory control circuit unit configured to control a correcting circuit to execute at least one first iteration decoding procedure of an LDPC on a first codeword according to a first clock signal. The memory control circuit unit is further configured to generate a control parameter according to a first iteration count of the at least one first iteration decoding procedure. The memory control circuit unit is further configured to output a second clock signal to the correcting circuit according to the control parameter. The memory control circuit unit is further configured to control the correcting circuit to execute at least one second iteration decoding procedure of the LDPC on a second codeword according to the second clock signal.

According to an exemplary embodiment of the present invention, a memory control circuit unit configured to control a rewritable non-volatile memory module including a plurality of physical erasing units is provided. The memory control circuit unit includes a host interface, a memory interface, a memory management circuit, an error checking and correcting circuit and a clock signal output circuit. The host interface is configured to be coupled to a host system. The memory interface is configured to be coupled to the rewritable non-volatile memory module. The memory management circuit is coupled with the host interface and the memory interface. The error checking and correcting circuit is coupled to the memory management circuit and includes a correcting circuit. The correcting circuit is configured to execute at least one first iteration decoding procedure of an LDPC on a first codeword according to a first clock signal. The clock signal output circuit is coupled to the error checking and correcting circuit and configured to output the first clock signal to the correcting circuit. The clock signal output circuit is further configured to generate a control parameter according to a first iteration count of the at least one first iteration decoding procedure. The clock signal output circuit is further configured to output a second clock signal to the correcting circuit according to the control parameter. The correcting circuit is further configured to execute at least one second iteration decoding procedure of the LDPC on a second codeword according to the second clock signal.

To sum up, in one of the exemplary embodiments of the present invention, the frequency of a clock signal currently used by the correcting circuit in charge of iteration decoding can be dynamically adjusted according to the iteration counts of the executed iteration decoding procedures. Thereby, power consumption for decoding can be reduced, and the decoding efficiency can be effectively maintained. It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
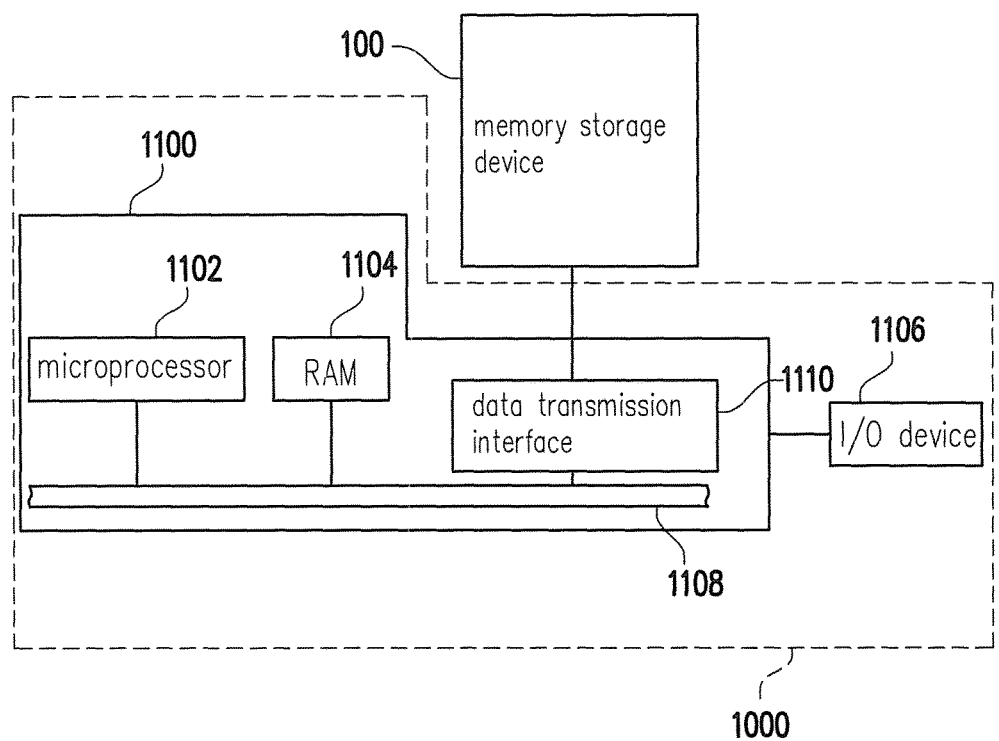
FIG. 1 is a schematic diagram illustrating a host system and a memory storage device according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (i.e. a memory storage system) includes a rewritable non-volatile memory module and a controller (i.e. a control circuit). The memory storage device is usually used together with a host system, such that the host system can write data into or read data from the memory storage device.

Figure 2:
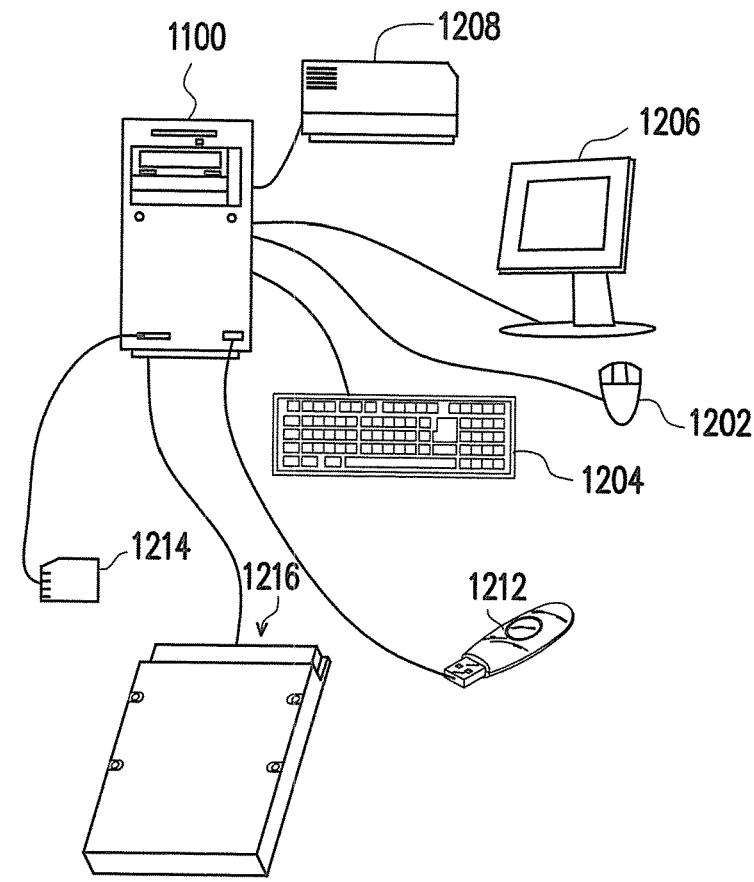
FIG. 2 is a schematic diagram illustrating a computer, an input/output (I/O) device, and a memory storage device according to an exemplary embodiment of the present invention.

FIG. 1 is a schematic diagram illustrating a host system and a memory storage device according to an exemplary embodiment of the present invention. FIG. 2 is a schematic diagram illustrating a computer, an input/output (I/O) device, and a memory storage device according to an exemplary embodiment of the present invention.

With reference to FIG. 1, a host system 1000 generally includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 2. It should be understood that the devices illustrated in FIG. 2 are not intended to limit the I/O device 1106, and the I/O device 1106 may further include other devices.

In the present exemplary embodiment, the memory storage device 100 is coupled to other elements of the host system 1000 through the data transmission interface 1110. With the operation of the microprocessor 1102, the RAM 1104 and the I/O device 1106, data can be written into or read from the memory storage device 100. For instance, the memory storage device 100 may be a rewritable non-volatile memory storage device, such as a flash drive 1212, a memory card 1214, or a solid state drive (SSD) 1216, as shown in FIG. 2.

Figure 3:
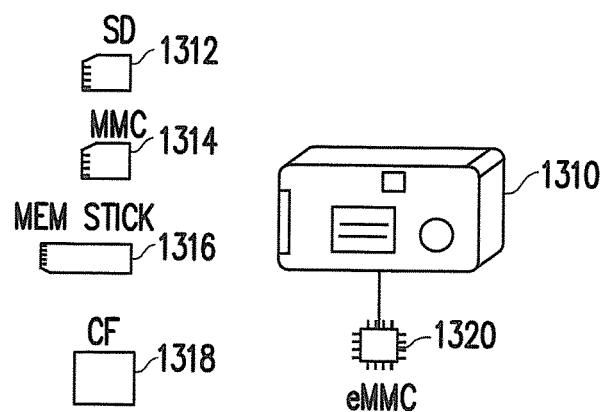
FIG. 3 is a schematic diagram illustrating a host system and a memory storage device according to an exemplary embodiment of the present invention.

FIG. 3 is a schematic diagram illustrating a host system and a memory storage device according to an exemplary embodiment of the present invention.

Generally speaking, the host system 1000 can substantially be any system collocated with the memory storage device 100 for storing data. Even though the host system 1000 is implemented as a computer system in the present exemplary embodiment, in another exemplary embodiment of the present invention, the host system 1000 may be a digital camera, a video camera, a telecommunication device, an audio player, or a video player. For example, in a scenario that the host system 1000 is a digital camera (video camera) 1310, the rewritable non-volatile memory storage device may be a secure digital (SD) card 1312, a multi media card (MMC) 1314, a memory stick 1316, a compact flash (CF) card 1318 or an embedded storage device 1320 (as shown in FIG. 3). The embedded storage device 1320 includes an Embedded MMC (eMMC). It should be mentioned that the eMMC is directly coupled to a substrate of the host system.

Figure 4:
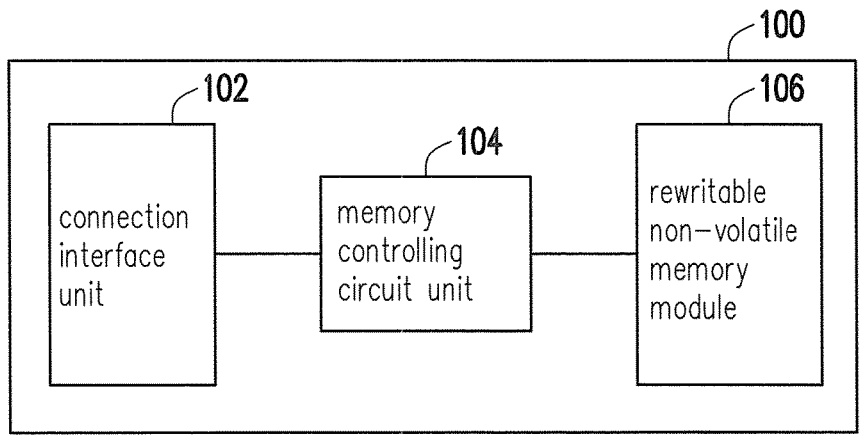
FIG. 4 is a schematic block diagram illustrating the memory storage device shown in FIG. 1.

FIG. 4 is a schematic block diagram illustrating the memory storage device shown in FIG. 1.

With reference to FIG. 4, the memory storage device 100 includes a connection interface unit 102, a memory control circuit unit 104, and a rewritable non-volatile memory module 106.

In the present exemplary embodiment, the connection interface unit 102 complies with a serial advanced technology attachment (SATA) standard. However, it should be understood that the present invention is not limited thereto, and the connection interface unit 102 may also comply with a parallel advanced technology attachment (PATA) standard, an institute of electrical and electronic engineers (IEEE) 1394 standard, a peripheral component interconnect express (PCI Express) standard, a universal serial bus (USB) standard, a secure digital (SD) interface standard, an ultra high speed-I (UHS-I) interface standard, an ultra high speed-II (UHS-II) interface standard, a memory stick (MS) interface standard, a multi media card (MMC) interface standard, an embedded multimedia card (eMMC) interface standard, a universal flash storage (UFS) interface standard, a compact flash (CF) interface standard, an integrated device electronics (IDE) standard, or other suitable standards. The connection interface unit 102 may be package with the memory control circuit unit 104 in one chip or laid outside a chip having the memory control circuit unit 104.

The memory control circuit unit 104 is configured to execute a plurality of logic gates or control commands which are implemented in a hardware fonn or in a firmware form and perform operations such as data writing, reading or erasing in the rewritable non-volatile memory module 106 according to the command of the host system 1000. In an exemplary embodiment, when the memory control circuit unit 104 sends a write command sequence, a read command sequence and an erase command sequence to perform the data writing, reading and erasing operations. Each command sequence may include one or more signals, identification codes, data or a combination thereof, and the present invention is not intended to limit the content contained in each command sequence.

The rewritable non-volatile memory module 106 is coupled to the memory control circuit unit 104 and configured to store data written by the host system 1000. The rewritable non-volatile memory module 106 may be a single-level cell (SLC) NAND flash memory module, a multi level cell (MLC) NAND flash memory module (i.e., a flash memory module capable of storing data of 2 bits in one memory cell), a trinary-level cell (TLC) NAND flash memory module (i.e., a flash memory module capable of storing data of 3 bits in one memory cell), any other flash memory module, or any other memory module with the same characteristics.

Figure 5:
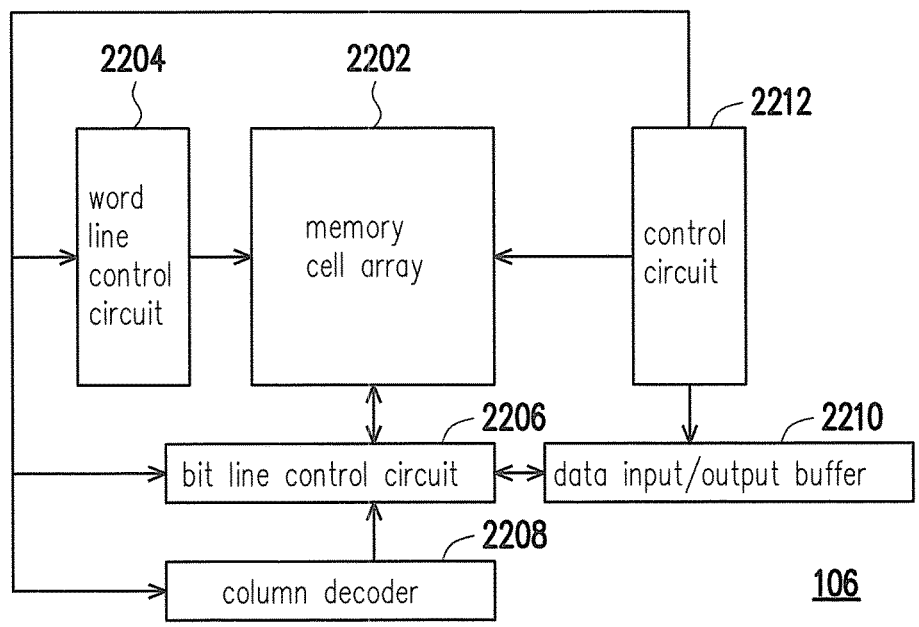
FIG. 5 is a schematic block diagram illustrating a rewritable non-volatile memory module according to an exemplary embodiment of the present invention.
Figure 6:
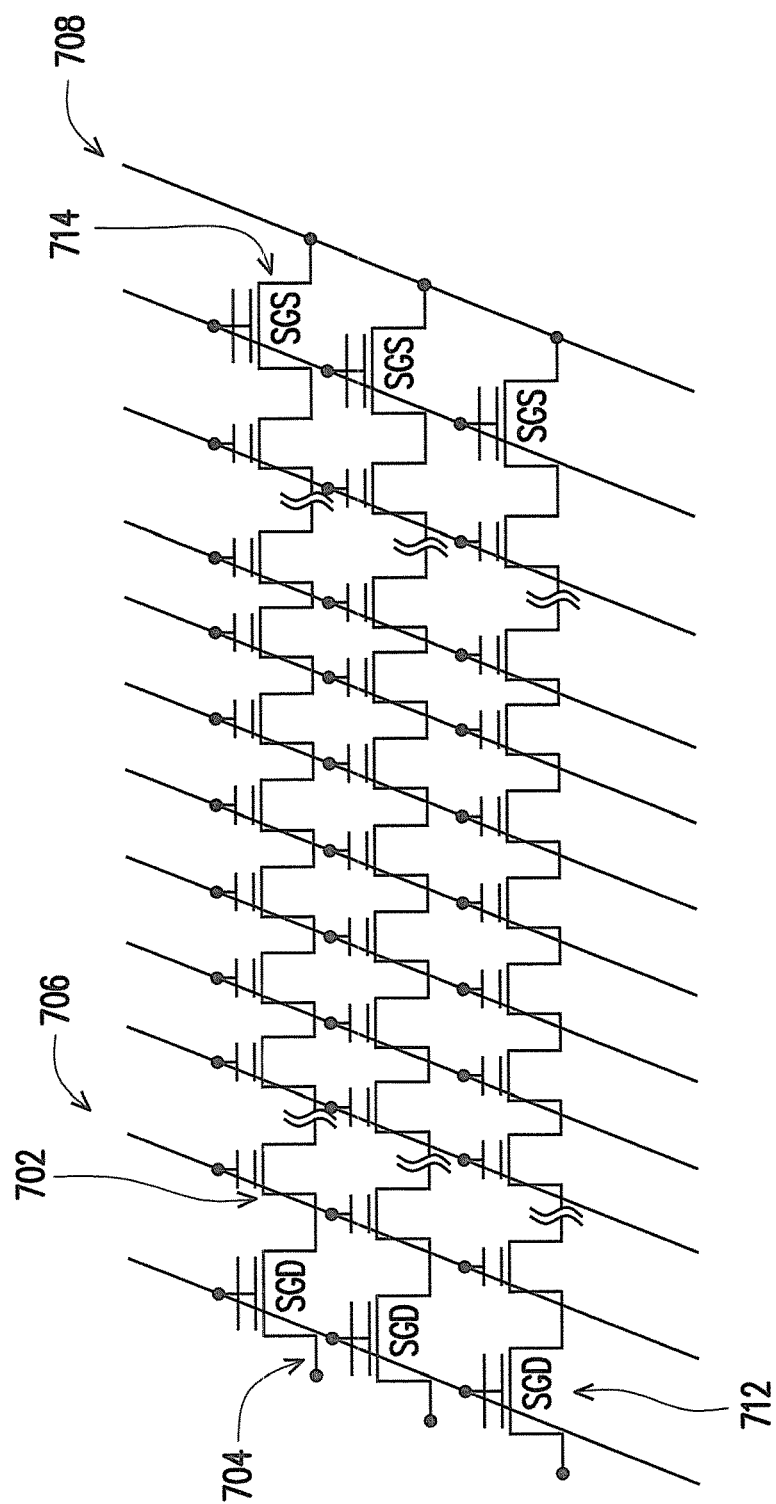
FIG. 6 is a schematic diagram illustrating a memory cell array according to an exemplary embodiment of the present invention.

FIG. 5 is a schematic block diagram illustrating a rewritable non-volatile memory module according to an exemplary embodiment of the present invention. FIG. 6 is a schematic diagram illustrating a memory cell array according to an exemplary embodiment of the present invention.

With reference to FIG. 5, the rewritable non-volatile memory module 106 includes a memory cell array 2202, a word line control circuit 2204, a bit line control circuit 2206, a column decoder 2208, a data input/output buffer 2210 and a control circuit 212.

In the present exemplary embodiment, the memory cell array 2202 includes a plurality of memory cells 702 for storing data, a plurality of select gate drain (SGD) transistors 712, a plurality of select gate source (SGS) transistors 714, and a plurality of bit lines 704, a plurality of word lines 706 and a common source line 708 which are connected with the memory cells 702 (as shown in FIG. 6). The memory cells 702 are disposed at intersections formed by the bit lines 704 and the word lines 706 in an array form (or in a three-dimensional stacking form). When the memory control circuit unit 104 receives a write command or a read command, the control circuit 2212 controls the word line control circuit 2204, the bit line control circuit 2206, the column decoder 2208, the data input/output buffer 2210 to write data into or read data from the memory cell array 2202. Therein, the word line control circuit 2204 is configured to control voltages applied to the word lines 706, the bit line control circuit 2206 is configured to control voltages applied to the bit lines 704, the column decoder 2208 is configured to select the corresponding bit line according to a row address in a command, and the data input/output buffer 2210 is configured to temporarily store the data.

Each of the memory cells in the rewritable non-volatile memory module 106 stores one or more bits by the changing of a threshold voltage. Specifically, there is a charge trapping layer between a control gate and a channel of each memory cell. Through applying a writing voltage to the control gate, an amount of electrons in the charge trapping layer is changed, such that the threshold voltage of the memory cell is changed. This process of the changing of the threshold voltage is also referred to as "writing data into the memory cell" or "programming the memory cell". As the threshold voltage is changed, each of the memory cells of the memory cell array 2202 has a plurality of storage states. Meanwhile, the storage states of the memory cells may be determined through the reading voltages, so as to obtain the one or more bits stored by each of the memory cells.

Figure 7:
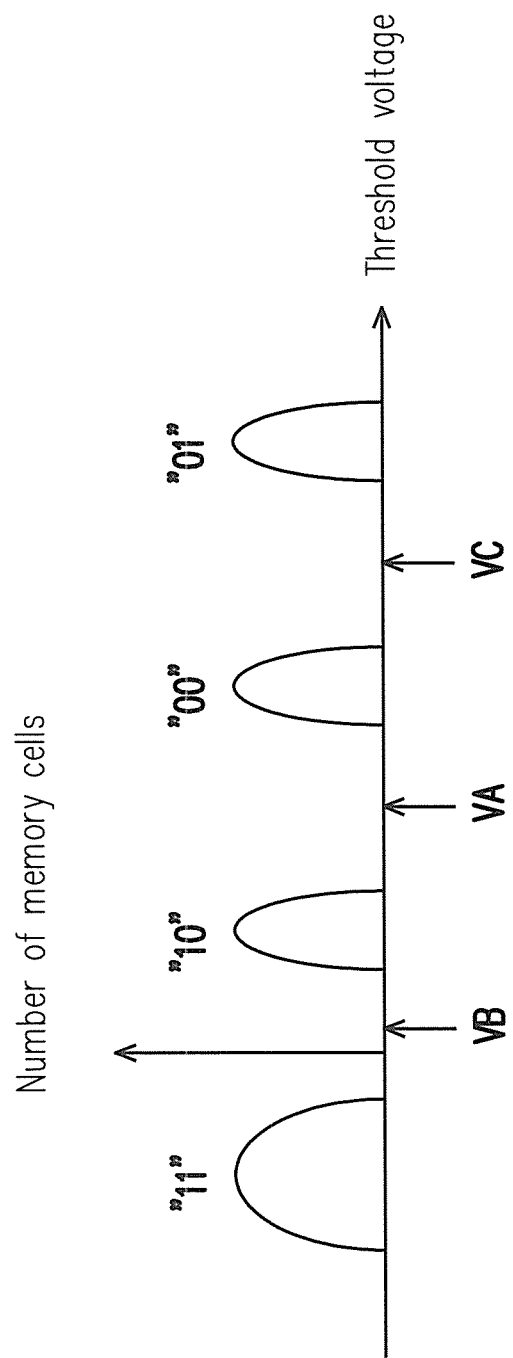
FIG. 7 is a statistical distribution diagram illustrating gate voltages corresponding to data stored in a memory array according to an exemplary embodiment of the present invention.

FIG. 7 is a statistical distribution diagram illustrating gate voltages corresponding to data stored in a memory array according to an exemplary embodiment of the present invention.

With reference to FIG. 7 which takes an MLC NAND flash memory for example, in which each of the memory cells has four storage states depending on different threshold voltages, and the states represent bits "11", "10", "00" and "01", respectively. In other words, each of the states includes a least significant bit (LSB) and a most significant bit (MSB). In the present exemplary embodiment, a first bit counted from the left in the states (i.e., "11", "10", "00" and "01") is the LSB, and a second bit counted from the left is the MSB. Accordingly, in the exemplary embodiment, each of the memory cells may store two bits. It should be understood that the storage states corresponding to the threshold voltage as illustrated in the FIG. 7 are merely an example. In another exemplary embodiment of the invention, the storage states corresponding to the threshold voltage may also have an arrangement of "11", "10", "01" and "00" that is arranged according to the threshold voltage from small to large, or other arrangements. In addition, in another exemplary embodiment, it can also be defined that the first bit counted from the left is the MSB, and the second bit counted from the left is the LSB.

Figure 8:
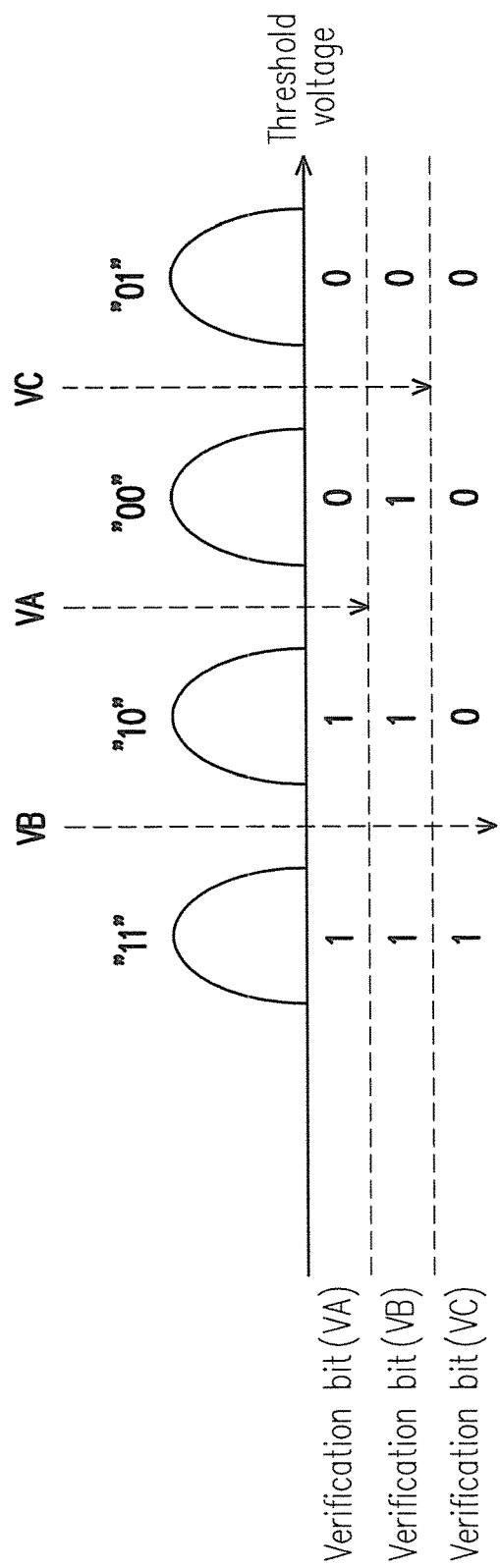
FIG. 8 is a schematic diagram of reading data from a memory cell according to an exemplary embodiment of the present invention.

FIG. 8 is a schematic diagram of reading data from a memory cell according to an exemplary embodiment of the present invention, where an MLC NAND flash memory is taken as an example.

With reference to FIG. 8, in a reading operation for the memory cells of the memory cell array 2202, the read voltage is applied to the control gate, and data stored in the memory cells are identified according whether the channel of the memory cell is turned on. A verification bit (VA) is configured to indicate whether the channel of the memory cell is turned on when a read voltage VA is applied; a verification bit (VC) is configured to indicate whether the channel of the memory cell is turned on when a read voltage VC is applied; and a verification bit (VB) is configured to indicate whether the channel of the memory cell is turned on when a read voltage VB is applied. It is assumed that the corresponding channel of the memory cell being turned on is indicated by the verification bit of "1", and the corresponding channel of the memory cell not being turned on is indicated by the verification bit of "0". As shown in FIG. 8, which of the storage statuses the memory cell is in may be determined according to the verification bits (VA) to (VC), and thereby, the bits being stored may be obtained.

Figure 9:
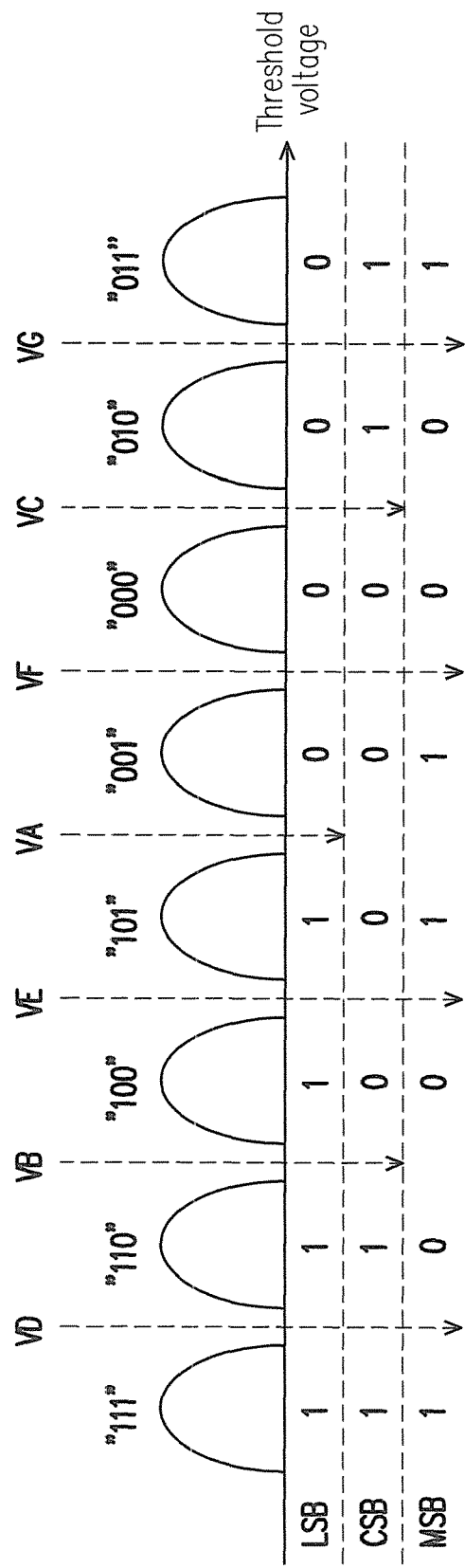
FIG. 9 is a schematic diagram of reading data from a memory cell according to another exemplary embodiment of the present invention.

FIG. 9 is a schematic diagram of reading data from a memory cell according to another exemplary embodiment of the present invention.

With reference to FIG. 9 which takes a TLC NAND flash memory for example, each of the storage states includes a first bit counted from the left being the least significant bit (LSB), a second bit counted from the left being a center significant bit (CSB) and a third bit counted from the left being the most significant bit (MSB). In the present exemplary embodiment, each of the memory cells has eight storage states (i.e., "111", "110", "100", "101", "001", "000", "010" and "011") depending on different threshold voltages. The bits stored in the memory cell may be identified by applying the read voltages VA to VC to the control gate. Therein, it should be noted that, an arranging sequence of the eight storage states may be decided based on designs of manufacturers without being limited by the arranging sequence of the present exemplary embodiment.

Figure 10:
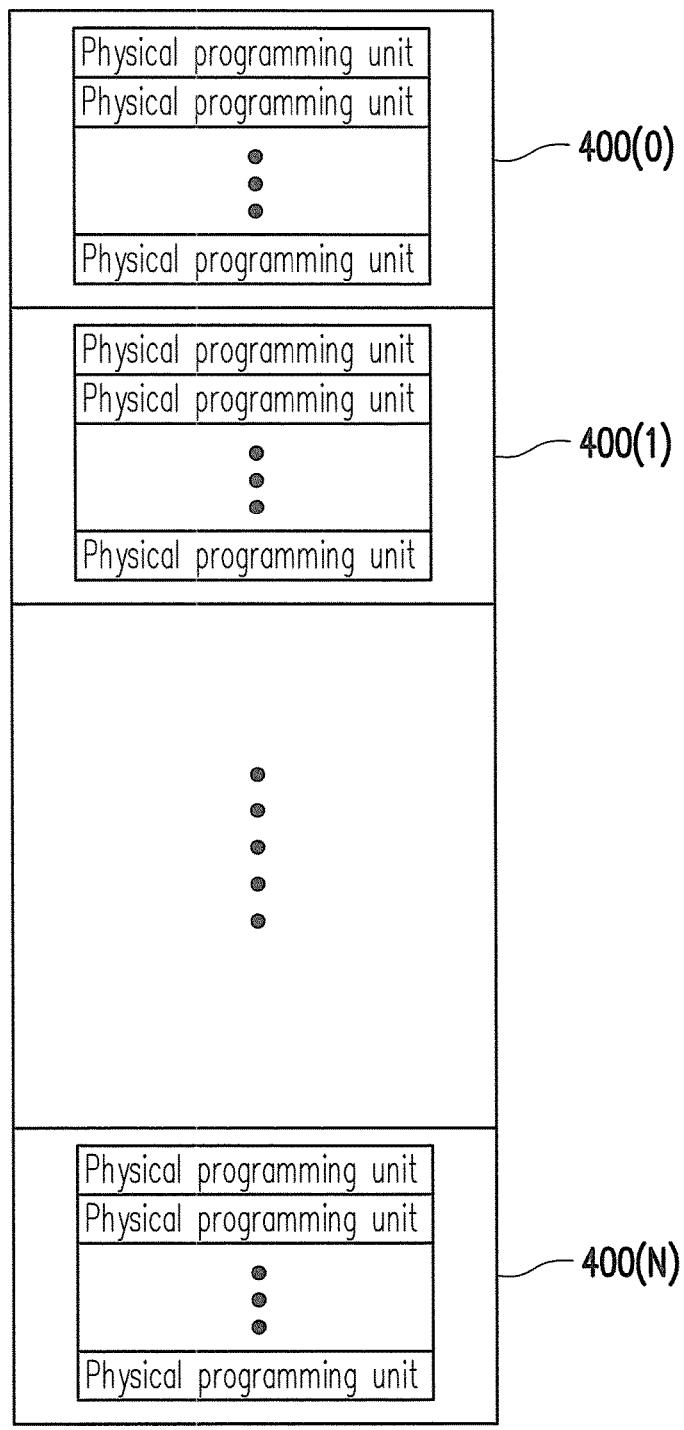
FIG. 10 is a schematic diagram of managing the rewritable non-volatile memory module according to an exemplary embodiment of the present invention.

FIG. 10 is a schematic diagram of managing the rewritable non-volatile memory module according to an exemplary embodiment of the present invention.

With reference to FIG. 10, the memory cells 702 of the rewritable non-volatile memory module 106 constitute a plurality of physical programming units, and the physical programming units constitutes a plurality of physical erasing units 400(0) to 400(N). Specifically, the memory cells on the same word line are grouped into one or more physical programming units. In case each of the memory cells can store more than two bits, the physical programming units on the same word line can be classified into a lower physical programming unit and an upper physical programming unit. For instance, the LSB of each memory cell is the lower physical programming unit, and the MSB of each memory cell is belonging to the upper physical programming unit. Generally, in the MLC NAND flash memory, a writing speed of the lower physical programming unit is faster than a writing speed of the upper physical programming unit, or reliability of the lower physical programming unit is higher than reliability of the upper physical programming unit. In the present exemplary embodiment, a physical programming unit is the smallest unit for programming. That is, a physical programming unit is the smallest unit for writing data. For example, a physical programming unit is a physical page or a physical sector. In case the physical programming unit is the physical page, each physical programming unit commonly includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512 bytes (B). However, in other exemplary embodiments, the data bit area may also include 8, 16, or more or less of the physical sectors, and the present invention is not intended to limit the size and the number of the physical sectors. On the other hand, a physical erasing unit is the smallest unit for erasing. Namely, each physical erasing unit contains the least number of memory cells to be erased altogether. For instance, a physical erasing unit is a physical block.

Figure 11:
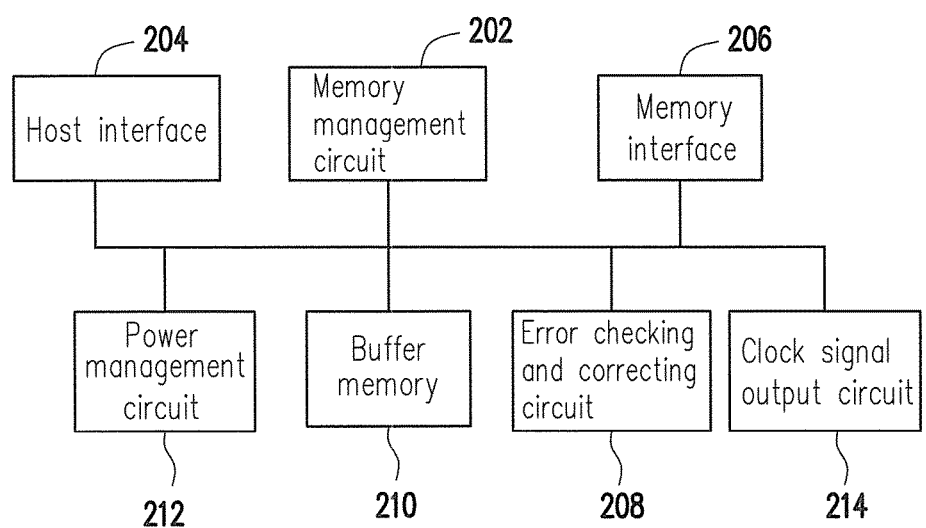
FIG. 11 is a schematic block diagram illustrating a memory control circuit unit according to an exemplary embodiment of the present invention.

FIG. 11 is a schematic block diagram illustrating a memory control circuit unit according to an exemplary embodiment of the present invention. It should be understood that the structure of the memory control circuit unit depicted in FIG. 11 is only an example, and the invention is not limited thereto.

With reference to FIG. 11, the memory control circuit unit 104 includes a memory management circuit 202, a host interface 204, a memory interface 206 and an error checking and correcting circuit 208.

The memory management circuit 202 is configured to control overall operations of the memory control circuit unit 104. Specifically, the memory management circuit 202 has a plurality of control commands, and when the memory storage device 100 is in operation, the control commands are executed to perform various operations such as data writing, data reading and data erasing. Operations of the memory management circuit 202 are equivalent to the operations of the memory control circuit unit 104, and thus, related description will not be repeated hereinafter.

In the present exemplary embodiment, the control commands of the memory management circuit 202 are implemented in a firmware form. For instance, the memory management circuit 202 has a microprocessor unit (not shown) and a read-only memory (not shown), and the control commands are burnt into the read-only memory. When the memory storage device 100 is in operation, the control commands are executed by the microprocessor unit to perform various data operations, such as data writing, data reading or data erasing.

In another exemplary embodiment, the control commands of the memory management circuit 202 may also be stored in a specific area (e.g., a system area in the memory module exclusively used for storing the system data) of the rewritable non-volatile memory module 106 as program codes. Moreover, the memory management circuit 202 has a microprocessor unit (not shown), a read-only memory (not shown), and a random access memory (not shown). Specially, the read-only memory has a boot code. When the memory controller 104 is enabled, the microprocessor unit first executes the boot code to load the control commands stored in the rewritable non-volatile memory module 106 into the random access memory of the memory management circuit 202. Afterwards, the microprocessor unit executes the control commands for various data operations such as data writing, data reading and data erasing.

Additionally, in another exemplary embodiment, the control commands of the memory management circuit 202 may also be implemented in a hardware form. For example, the memory management circuit 202 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory management circuit is configured to manage the physical units of the rewritable non-volatile memory module 106, the memory writing circuit is configured to issue a write command to the rewritable non-volatile memory module 106 for writing data to the rewritable non-volatile memory module 106, the memory reading circuit is configured to issue a read command to the rewritable non-volatile memory module 106 for reading data therefrom, the memory erasing circuit is configured to issue an erase command to the rewritable non-volatile memory module 106 for erasing data therefrom, and the data processing circuit is configured to process data to be written to the rewritable non-volatile memory module 106 or data read from the rewritable non-volatile memory module 106.

The host interface 204 is coupled to the memory management circuit 202 and configured to receive and identify commands and data transmitted from the host system 1000. Namely, the commands and data sent by the host system 1000 are transmitted to the memory management circuit 202 through the host interface 204. In the present exemplary embodiment, the host interface 204 complies with the SATA standard. However, it should be understood that the present invention is not limited thereto, and the host interface 204 may also comply with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 206 is coupled to the memory management circuit 202 for accessing to the rewritable non-volatile memory module 106. In other words, the data to be written into the rewritable non-volatile memory module 106 is converted to a format acceptable for the rewritable non-volatile memory module 106 by the memory interface 206. Specifically, in case the memory management circuit 202 is to access to the rewritable non-volatile memory module 106, the memory interface 206 transmits corresponding command sequences. Each of the command sequences may contain one or more signals or data on the bus. For example, a read command sequence may contain information including a read identification code, a memory address and so on.

The error checking and correcting circuit 208 is coupled to the memory management circuit 202 and configured to execute an error checking and correcting procedure to ensure the accuracy of data. To be specific, when the memory management circuit 202 receives a write command from the host system 1000, the error checking and correcting circuit 208 generates an error correcting code (ECC) and/or error detecting code (EDC) for the data corresponding to the write command, and the memory management circuit 202 writes the data corresponding to the write command and the corresponding ECC code and/or EDC into the rewritable non-volatile memory module 106. Subsequently, when reading the data from the rewritable non-volatile memory module 106, the memory management circuit 202 simultaneously reads the ECC code and/or the EDC corresponding to the data, and the error checking and correcting circuit 208 executes an error checking and correcting procedure on the read data based on the ECC and/or the EDC. In the present embodiment, the error checking and correcting circuit 208 uses a low density parity code (LDPC).

In an exemplary embodiment, the memory control circuit unit 104 further includes a buffer memory 210 and a power management circuit 212.

The buffer memory 210 is coupled to the memory management circuit 202 and configured to temporarily store data and commands from the host system 1000 or data from the rewritable non-volatile memory module 106.

The power management circuit 212 is coupled to the memory management circuit 202 and configured to control the power of the memory storage device 100.

In an LDPC code, a valid codeword is defined by using a parity check matrix. Hereinafter, a parity check matrix is marked as H, and a codeword is marked as CW. According to an equation (1) below, in case a result calculated by multiplying the parity check matrix H by the codeword CW is a zero vector, it indicates that the codeword CW is a valid codeword. Therein, an operator $\otimes$ represents a mod-2 matrix multiplication. In other words, a null space of the matrix H includes all valid codewords. However, the present invention is not intended to limit the content of the codeword CW. For instance, the codeword CW may also include an ECC code or an EDC generated by using any algorithm.

$$H \otimes CW^T = 0 \qquad (1)$$

Therein, a dimension of the matrix H is k-by-n, and a dimension of the codeword CW is 1-by-n, where k and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n-k), and a dimension of the vector P is 1-by-k. Hereinafter, the message bits and the parity bits are collectively referred to as data bits. In other words, the codeword CW includes n data bits, where a length of the message bits is (n-k) bits, and a length of the parity bits is k bits. Namely, a code rate of the codeword CW is (n-k)/n.

Generally, a generation matrix (marked as G hereinafter) is used during decoding, so that an equation (2) below may be satisfied by arbitrary values of the vector M, where a dimension of the generation matrix G is (n-k)-by-n.

$$M \otimes G = [M \; P] = CW \qquad (2)$$

Therein, the codeword CW generated by the equation (2) is a valid codeword. Therefore, when the equation (2) is substituted into the equation (1), an equation (3) below may be obtained accordingly.

$$H \otimes G^T \otimes M^T = 0 \qquad (3)$$

Since the vector M may be arbitrary values, an equation (4) below is definitely satisfied. In other words, after the parity check matrix H is determined, the corresponding generation matrix G may also be determined.

$$H \otimes G^T = 0 \qquad (4)$$

When decoding the codeword CW, a parity check procedure is first executed on the data bits in the codeword. For instance, the parity check matrix H may be multiplied by the codeword CW to generate a vector (which is marked as S hereinafter, as shown in an equation (5) below). If it is assumed that the vector S is the zero vector, the codeword CW may be directly output. If it is assumed that the vector S is not the zero vector, it indicates that the codeword CW is not the valid codeword.

$$H \otimes CW^T = S \qquad (5)$$

A dimension of the vector S is k-by-1, in which each element is referred to as a syndrome. If the codeword CW is not the valid codeword, the error checking and correcting circuit 208 executes a decoding procedure attempting to correct error bits in the codeword CW.

Figure 12:
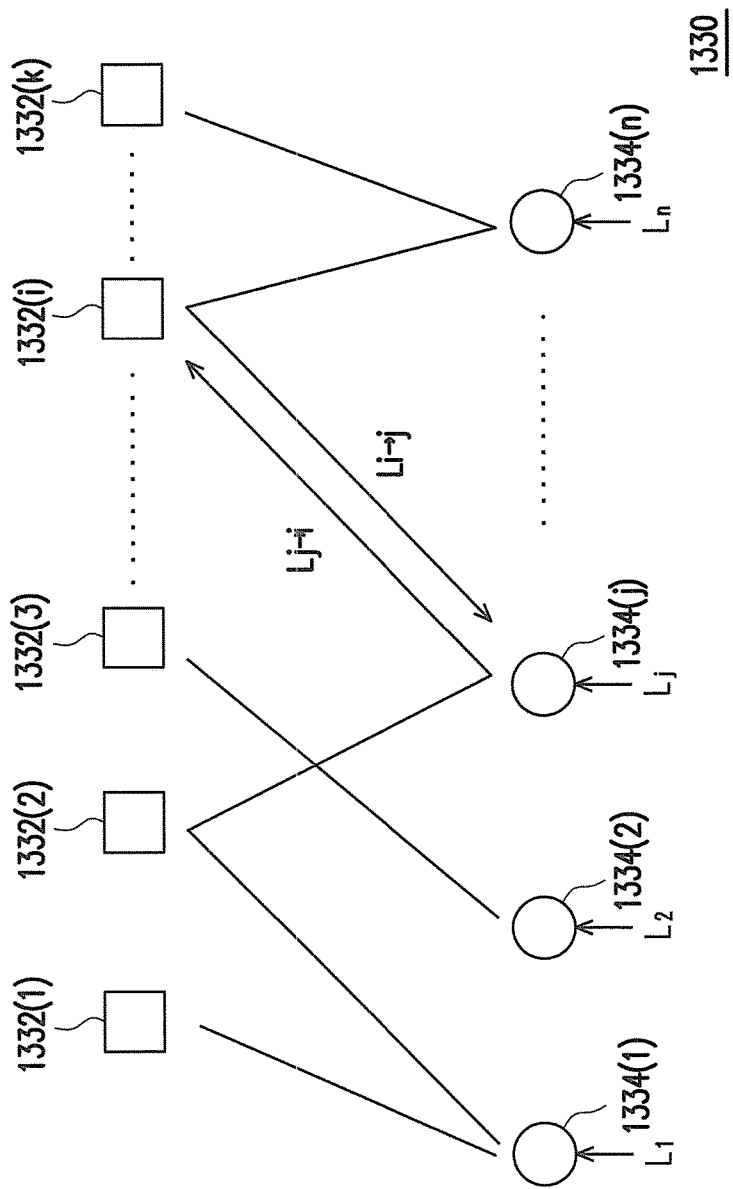
FIG. 12 is a schematic diagram illustrating a parity check matrix according to an exemplary embodiment of the present invention.

FIG. 12 is a schematic diagram illustrating a parity check matrix according to an exemplary embodiment of the present invention.

With reference to FIG. 12, generally, the parity check matrix H may be represented by a bipartite graph 1330 which includes parity nodes 1332(1) to 1332(k) and message nodes 1334(1) to 1334(n). Each of the parity nodes 1332(1) to 1332(k) is corresponding to one syndrome, and each of the message nodes 1334(1) to 1334(n) is corresponding to one data bit. Corresponding relation between the data bits and the syndromes (i.e., connecting relation between the message nodes 1334(1) to 1334(n) and the parity nodes 1332(1) to 1332(k)) is generated according to the parity check matrix. Specifically, in case an element at an $i^{th}$ row and a $j^{th}$ column is 1, an $i^{th}$ parity node 1332(i) is connected to a $j^{th}$ message node 1334(j), where i and j are positive integers.

When the memory management circuit 202 reads n data bits (which forms one codeword) from the rewritable non-volatile memory module 106, the memory management circuit 202 may also obtain channel reliability information of each of the data bits. The channel reliability information is used to represent probabilities (or referred to as a reliance level) of one specific data bit to be decoded into "1" or "0", which will be described in detail below. In the bipartite graph 1330, the message nodes 1334(1) to 1334(n) may also receive the corresponding channel reliability information. For instance, the message node 1332(1) may receive channel reliability information $L_1$ of a first data bit, and the message node 1332(j) may receive channel reliability information $L_j$ of a $j^{th}$ data bit.

The error checking and correcting circuit 208 may perform the decoding procedure according to a structure of the bipartite graph 1330 and the channel reliability information $L_1$ to $L_n$. The decoding procedure may include iteration decoding. Specifically, in the iteration decoding, the reliability information may be calculated for the parity nodes 1332(1) to 1332(k) by the message nodes 1334(1) to 1334(n), and the reliability information may also be calculated for the message nodes 1334(1) to 1334(n) by the parity nodes 1332(1) to 1332(k). The reliability information are transmitted along edges in the bipartite graph 1330. For example, reliability information $L_{i \to j}$ is one transmitted from the parity node 1332(i) to the message node 1334(j), and reliability information $L_{j \to i}$ is one transmitted from the message node 1334(j) to the parity node 1332(i). The reliability information is used to represent probabilities (or, the reliance level) of one specific data bit to be decoded into "1" or "0", which are considered by one node. For example, the reliability information $L_{j \to i}$ represents the reliance level (which may be positive or negative) for the $j^{th}$ data bit being decoded into "1" or "0" which is considered by the message node 1334(j), and the reliability information $L_{i \to j}$ represents the reliance level for the $j^{th}$ data bit being decoded into "1" or "0" which is considered by the message node 1332(i). The message nodes 1334(1) to 1334(n) and the parity nodes 1332(1) to 1332(m) may calculate the reliability information to be output according to the reliability message being inputted, and the reliability information is approximate to conditional probabilities of one specific data bit to be decoded into "1" or "0". Therefore, the above-mentioned process of transmitting the reliability information may also be referred to as a belief propagation.

Based on different algorithms being adopted, different reliability information may be calculated by the message nodes 1334(1) to 1334(n) and/or the parity nodes 1332(1) to 1332(k). For instance, the error checking and correcting circuit 208 may adopt a sum-product algorithm, a min-sum algorithm, or a bit-flipping algorithm, and the present invention is not intended to limit which algorithm is adopted.

In each iteration of the iteration decoding, the message nodes 1334(1) to 1334(n) may transmit the reliability information to the parity nodes 1332(1) to 1332(k), and the parity nodes 1332(1) to 1332(k) may transmit the reliability information to the message nodes 1334(1) to 1334(n). After each of the iteration, the message nodes 1334(1) to 1334(n) may calculate the probabilities of each data bit to be decoded into "1" or "0" according to the current reliability information. Subsequently, the parity check procedure is performed on the calculated data bit, namely, the codeword generated by the data bit is multiplied by the parity check matrix, parity check matrix so as to determine whether such codeword is valid. If the generated codeword is valid, the iteration decoding stopped. If the generated codeword is not valid, the next iteration is performed. If an iteration count of the iteration decoding is over a preset value the iterative decoding is also stopped, which indicates that the decoding fails.

Figure 13:
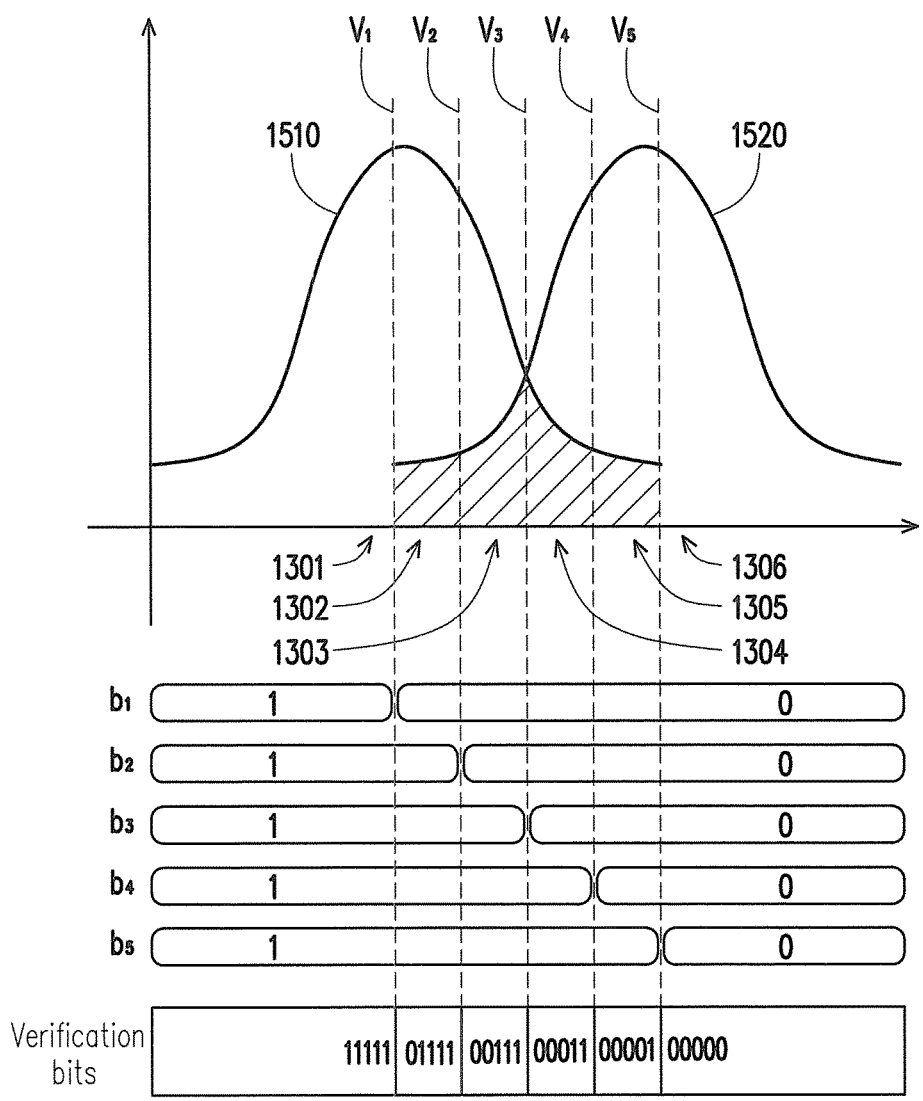
FIG. 13 is a schematic diagram of reading verification bits according to an exemplary embodiment of the present invention.

FIG. 13 is a schematic diagram of reading verification bits according to an exemplary embodiment of the present invention. With reference to FIG. 13, it is assumed that memory cells in a storage state 1510 store the bits of "1", and memory cells in a storage state 1520 store the bits of "0". The storage state 1510 partially overlaps the storage state 1520, namely, under some specific read voltages, part of the memory cells in the storage state 1510 are determined as belonging to the storage state 1520, and part of the memory cells in the storage state 1520 are determined as belonging to the storage state 1510. In an exemplary embodiment, after a read voltage is applied to a control gate of a memory cell, a verification bit obtained by the memory management circuit 202 may be "0" or "1" depending on whether the channel of the memory cell is turned on. In this case, it is assumed that a verification bit of "0" is corresponding to the channel of memory cell which is not turned on; otherwise, it is "1". If applying read voltages $V_1$ to $V_5$ to a specific memory cell, the memory management circuit 202 obtains 5 verification bits. Specifically, the read voltage $V_1$ is corresponding to a verification bit $b_1$, the read voltage $V_2$ is corresponding to a verification bit $b_2$, the read voltage $V_3$ is corresponding to a verification bit $b_3$, the read voltage $V_4$ is corresponding to a verification bit $b_4$, and the read voltage $V_5$ is corresponding to a verification bit $b_5$. The verification bit obtained from the verification bit $b_1$ to the verification bit $b_5$ by the memory management circuit 202 is "11111" if a threshold voltage of a memory cell is within an interval 1301, the obtained verification bit is "01111" if the threshold voltage of the a memory cell is within an interval 1302, the obtained verification bit is "00111" if the threshold voltage of the a memory cell is within an interval 1303, the obtained verification bit is "00011" if the threshold voltage of the a memory cell is within an interval 1304, the obtained verification bit is "00001" if the threshold voltage of the a memory cell is within an interval 1305, and the obtained verification bit is "00000" if the threshold voltage of the a memory cell is within an interval 1306. In another exemplary embodiment, the rewritable non-volatile memory module 106 may perform a mathematical operation on verification bits $b_1$ to $b_5$, and transmits the operated verification bits to the memory management circuit 202. For example, an exclusive or (XOR) operation is performed on the verification bits $b_2$ and $b_4$, and an exclusive or operation is performed on the verification bits $b_1$ and $b_5$. In this way, the memory management circuit 202 may only obtain 3 verification bits. However, the present invention is not intended to limit the number and the content of the verification bits.

In the present exemplary embodiment, one of the read voltages $V_1$ to $V_5$ is set to a sign read voltage. The sign read voltage is used to decide the data bit. For instance, in case the read voltage $V_3$ is a sign read voltage, the data bit is identical to the verification bit $b_3$; and in case the read voltage $V_2$ is the sign read voltage, the data is identical to the verification bit $b_2$, and so do the rest, likewise. In each interval, a log likelihood ratio (LLR) may be calculated based on the probability of the memory cell belonging to the storage state 1510 and the probability of the memory cell belonging to the storage state 1520, and the log likelihood ratio may also be referred to as the channel reliability information of the data bits in the present exemplary embodiment. In an exemplary embodiment, the log likelihood ratio corresponding to each interval may be calculated and stored in a lookup table in advance. The memory management circuit 202 may input the verification bits $b_1$ to $b_5$ into the lookup table, so as to obtain the corresponding log likelihood ratio to serve as the channel reliability information. The obtained channel reliability information (i.e., $L_1$ to $L_n$ in FIG. 12) may be used to perform said iterative decoding. In an exemplary embodiment, if different sign read voltages are set, the channel reliability information may be obtained by using different lookup tables.

In the above exemplary embodiment, if the number of the read voltages is x, x+1 intervals may be separated, where x is positive number. However, in another exemplary embodiment, if the number of the read voltage is x, y intervals may be separated, where y is arbitrary positive integer. However, the number of intervals corresponding to the x read voltages is not limited in the present invention. If the number of the read voltages is 1 (e.g., only the read voltage $V_3$ is used), the decoding procedure to be performed is also referred to as a hard bit mode decoding procedure. If the number of the read voltages is greater than 1, the decoding procedure to be performed is also referred to as a soft bit mode decoding procedure. Generally, information used by the soft bit mode decoding procedure is more, such that more error bits may be corrected, but an executing speed thereof is slower. Additionally, in an exemplary embodiment, when the hard bit mode decoding procedure is executed, the memory management circuit 202 may calculate the channel reliability information directly according to the obtained verification bits, instead of using the look up table. For instance, in case the verification bit is "1", the channel reliability information may be set to z, while if the verification bit is "0", the channel reliability information may be set to –z, where z is a real number.

Figure 14:
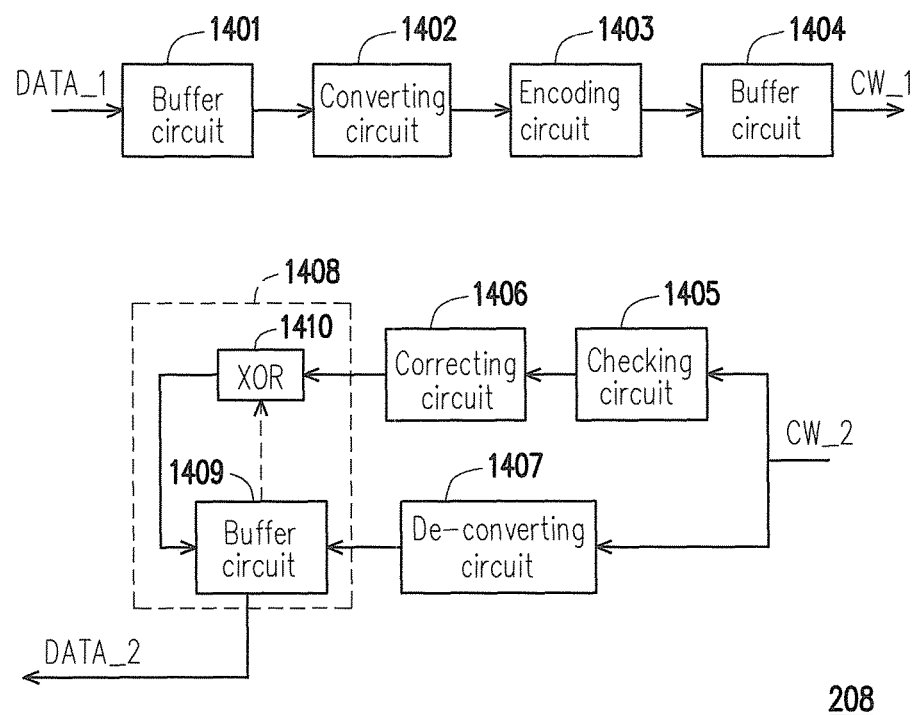
FIG. 14 is a schematic block diagram illustrating an error checking and correcting circuit according to an exemplary embodiment of the present invention.

FIG. 14 is a schematic block diagram illustrating an error checking and correcting circuit according to an exemplary embodiment of the present invention. It should be understood that the structure of the error checking and correcting circuit illustrated in FIG. 14 is only an example, and the present invention is not limited thereto.

With reference to FIG. 14, in the present exemplary embodiment, the error checking and correcting circuit 208 includes a buffer circuit 1401, a converting circuit 1402, an encoding circuit 1403, a buffer circuit 1404, a checking circuit 1405, a correcting circuit 1406, a de-converting circuit 1407 and an adding circuit 1408.

The buffer circuit 1401 is coupled to the host interface 204. When the host system 1000 is about to write data DATA_1 to the rewritable non-volatile memory module 106, the buffer circuit 1401 is configured to temporarily store the data DATA_1. The converting circuit 1402 is coupled to the buffer circuit 1401 and configured to convert the data DATA_1 stored in the buffer circuit 1401. The encoding circuit 1403 is coupled to the converting circuit 1402 and configured to encode the converted data DATA_1. In this case, the encoding circuit 1403 uses an LDPC code for encoding. However, in another exemplary embodiment, the encoding circuit 1403 may use a convolutional code, a turbo code or any other algorithm for encoding, which is not limited in the present invention. The encoding circuit 1403 temporarily stores the encoded data DATA_1 (i.e., a codeword CW_1) to the buffer circuit 1404, and the codeword CW_1 is transmitted to the rewritable non-volatile memory module 106 through the memory interface 206. For instance, the encoding circuit 1403 may generate the codeword CW_1 according to the equation (2) above.

When the host system 1000 is about to read data from the rewritable non-volatile memory module 106, a plurality of verification bits are read from the rewritable non-volatile memory module 106. The memory management circuit 202 generates a plurality of data bits according to the verification bits. For example, the data bits may be decided according to the sign read voltage. The data bits may form a codeword CW_2 and be transmitted to the checking circuit 1405. The checking circuit 1405 is configured to generate a plurality of syndromes corresponding to the codeword CW_2. Specifically, the checking circuit 1405 executes a parity check procedure on the codeword CW_2 to generate the syndromes. For instance, a plurality of syndromes may be obtained by multiplying a vector formed by the data bits by a parity check matrix. Nevertheless, the sign read voltage and the parity check procedure have been described above and will not repeated hereinafter. The correcting circuit 1406 is coupled to checking circuit 1405 and configured to executing decoding procedure of iteration decoding on the codeword CW_2 to generate error index information. For example, the error index information may include an error bit index. For example, the correcting circuit 1406 may execute a hard bit mode decoding procedure or a soft bit mode decoding procedure on the codeword CW_2, which is not limited in the present exemplary embodiment. Specifically, in an iteration decoding procedure of a LDPC, the correcting circuit 1406 may obtain reliability information of each of the data bits of the codeword CW_2 according to the syndromes and decides an index of error bits among the data bits according to the reliability information. When being about to determine whether a valid codeword is generated, the correcting circuit 1406 may determine whether the error bit index and the syndromes meet a parity condition. If the error bit index and the syndromes meet the parity condition, the correcting circuit 1406 may output error index information. The error index information is used to correct one or more data bits in the codeword CW_2 to generate a valid codeword. It should be noted that when performing decoding on a codeword, the correcting circuit 1406 may execute the iteration for one or more times until the valid codeword is obtained or a decoding failure occurs. Each iteration may also be referred to as an iteration decoding procedure. On the other hand, the codeword CW_2 is transmitted to the de-converting circuit 1407. The de-converting circuit 1407 and the converting circuit 1402 are corresponding to each other. If a data sequence of one data is converted by the converting circuit 1402, the de-converting circuit 1407 may recovery the converted data sequence. The de-converting circuit 1407 is configured to de-convert the codeword CW_2 and output the de-converted codeword CW_2. The adding circuit 1408 is coupled with the correcting circuit 1406 and the de-converting circuit 1407 and configured to generate data DATA_2 according to the error index information and the de-converted codeword CW_2. That is, the adding circuit 1408 may correct the codeword CW_2 according to the error index information. For instance, in the present exemplary embodiment, the adding circuit 1408 includes a buffer circuit 1409 and an XOR circuit 1410. The buffer circuit 1409 is configured to temporarily store the de-converted codeword CW_2, and the XOR circuit 1410 may perform mod-2 addition on the de-converted codeword CW_2 according to the error bit index. Thereby, the XOR circuit 1410 may generate the data DATA_2. In other words, the data DATA_2 is a valid codeword and may be transmitted to the host system 1000. It should be noted that the coupling relations among the circuits in FIG. 14 may be changed, and part of the circuits may be replaced by other circuits, which are not limited in the present invention.

Referring to FIG. 11 again, the memory control circuit unit 104 further includes a clock signal output circuit 214. The clock signal output circuit 214 is coupled to the memory management circuit 202, the host interface 204, the memory interface 206, the error checking and correcting circuit 208, the buffer memory 210 and the power management circuit 212. The clock signal output circuit 214 is configured to output a plurality of clock signals with the same or different frequencies to the memory management circuit 202, the host interface 204, the memory interface 206, the error checking and correcting circuit 208 buffer memory 210 and the power management circuit 212. In a circuit (e.g., the error checking and correcting circuit 208) contain a plurality of internal circuits, the clock signal output circuit 214 may also provide the clock signals with the same or different frequencies to the internal circuits, respectively. Additionally, in an exemplary embodiment, the clock signal output circuit 214 may provide the clock signal only to the error checking and correcting circuit 208, and another clock signal output circuit (not shown) may provide clock signals to the memory management circuit 202, the host interface 204, the memory interface 206, the buffer memory 210 and the power management circuit 212.

Figure 15:
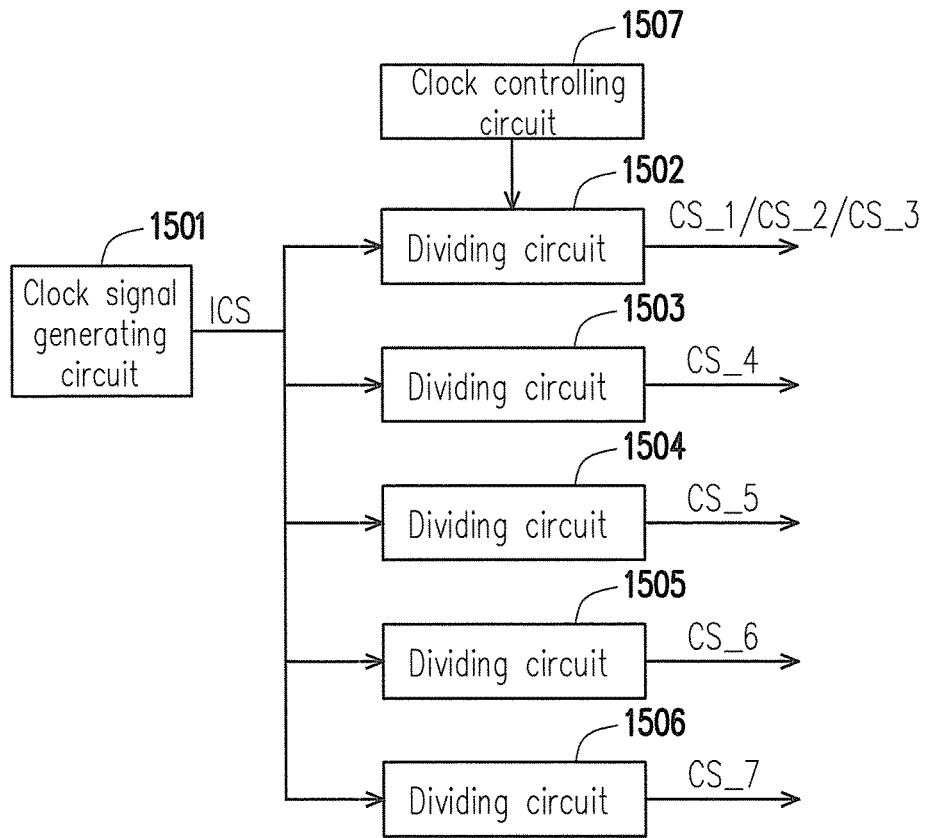
FIG. 15 is a schematic block diagram illustrating a clock signal output circuit according to an exemplary embodiment of the present invention.

FIG. 15 is a schematic block diagram illustrating a clock signal output circuit according to an exemplary embodiment of the present invention. It should be understood that the structure of the clock signal output circuit illustrated in FIG. 15 is only an example, and the present invention is not limited thereto.

With reference to FIG. 15, in the present exemplary embodiment, the clock signal output circuit 214 includes a clock signal generating circuit 1501, dividing circuits 1502 to 1506 and a clock controlling circuit 1507. The clock signal generating circuit 1501 is configured to provide an initial clock signal ICS. For instance, the clock signal generating circuit 1501 includes an oscillator. The dividing circuits 1502 to 1506 is coupled to the clock signal generating circuit 1501 and configured to output divided clock signals according to the initial clock signal ICS. The number of the dividing circuits 1502 to 1506 may be more or less, which is not limited in the present invention. In the present exemplary embodiment, the dividing circuit 1502 is coupled to the correcting circuit 1406 and configured to provide a clock signal CS_1 (i.e., a first clock signal)/a clock signal CS_2 (i.e., a second clock signal)/a clock signal CS_3 (i.e., a third clock signal) to the correcting circuit 1406. The dividing circuit 1503 is coupled to the checking circuit 1405 and configured to provide a clock signal CS_4 (i.e., a fourth clock signal) to the checking circuit 1405. The dividing circuit 1504 is coupled to the memory management circuit 202, the host interface 204, the buffer circuit 1401, the converting circuit 1402, the buffer circuit 1404, the de-converting circuit 1407 and the adding circuit 1408 and configured to provide a clock signal CS_5 (i.e., a fifth clock signal) to the memory management circuit 202, the host interface 204, the buffer circuit 1401, the converting circuit 1402, the buffer circuit 1404, the de-converting circuit 1407 and the adding circuit 1408. The dividing circuit 1505 is coupled to the encoding circuit 1403 and configured to provide a clock signal CS_6 to the encoding circuit 1403. The dividing circuit 1506 is coupled to the memory interface 206 and configured to provide a clock signal CS_7 to the memory interface 206. Namely, in the present exemplary embodiment, the clock signal CS_1/CS_2/CS_3 is configured to drive the correcting circuit 1406, the clock signal CS_4 is configured to drive the checking circuit 1405, the clock signal CS_5 is configured to drive the memory management circuit 202, the host interface 204, the buffer circuit 1401, the converting circuit 1402, the buffer circuit 1404, the de-converting circuit 1407 and the adding circuit 1408, the clock signal CS_6 is configured to drive the encoding circuit 1403, and the clock signal CS_7 is configured to drive the memory interface 206. The present invention is not intended to limit a frequency of each of the clock signals CS_1 to CS_7. Moreover, in another exemplary embodiment, the number of the dividing circuits 1502 to 1506 and the coupling relations of the dividing circuits 1502 to 1506 and each circuit in the memory control circuit unit 106 may also be adjustable, which are not limited in the present invention is not. The clock controlling circuit 1507 is coupled to the dividing circuit 1502 and configured to control the dividing circuit 1502. For example, the clock controlling circuit 1507 may control the frequency of the clock signal output by the dividing circuit 1502. Additionally, in another exemplary embodiment, the clock controlling circuit 1507 may also be coupled to at least one of the dividing circuits 1502 to 1506, so as to respectively control the frequency of the clock signal output by at least one of the dividing circuits 1502 to 1506.

If it is assumed that the dividing circuit 1502 currently provides the clock signal CS_1 to the correcting circuit 1406, the correcting circuit 1406 may execute at least one first iteration decoding procedure of the LDPC on a codeword (i.e., the first codeword) according to the clock signal CS_1. The iteration decoding procedure executed by the correcting circuit 1406 has been described above and will not be repeated hereinafter. The clock controlling circuit 1507 is further coupled to the correcting circuit 1406 and generates a control parameter (i.e., a control signal) according to an iteration count (i.e., first iteration count) of the at least one first iteration decoding procedure. In other words, the first iteration count serves to indicate how many times the correcting circuit 1406 executes the first iteration decoding procedure to decode the first codeword. The first iteration count may be transmitted to the clock controlling circuit 1507 after being accumulated by the correcting circuit 1406, or immediately accumulated by the clock controlling circuit 1507, which is not limited in the present invention. The clock controlling circuit 1507 transmits the control parameter to the dividing circuit 1502, and the dividing circuit 1502 outputs the clock signal CS_2 to the correcting circuit 1406 according to the control parameter. In this case, if another codeword (i.e., the second codeword) needs to be decoded, the correcting circuit 1406 executes at least one second iteration decoding procedure of the LDPC on the second codeword according to the clock signal CS_2.

In an exemplary embodiment, the correcting circuit 1406 may further execute at least one third iteration decoding procedure of the LDPC on yet another codeword (i.e., the third codeword) according to the clock signal CS_3. For example, the at least one third iteration decoding procedure may be executed before the first iteration decoding procedure or after the first iteration decoding procedure and before the second iteration decoding procedure. The clock controlling circuit 1507 calculates an average of the first iteration count of the at least one first iteration decoding procedure and an iteration count (i.e., a third iteration decoding count) of the at least one third iteration decoding procedure. The average may also a weighted average, or alternatively, in a scenario where an average of more iteration counts is calculated, the average may also be a median value, which is not limited in the present invention. The clock controlling circuit 1507 generates the control parameter according to the average.

In an exemplary embodiment, the control parameter includes a first control parameter and a second control parameter. The first control parameter is used to increase a frequency of a clock signal, and the second control parameter is used to reduce the frequency of the clock signal. The clock controlling circuit 1507 determines whether the average is over a first threshold or lower than a second threshold, where the first threshold is equal to or higher than the second threshold. If the average is over the first threshold, the clock controlling circuit 1507 outputs the first control parameter to the dividing circuit 1502. If the average is lower than the second threshold, the clock controlling circuit 1507 outputs the second control parameter to the dividing circuit 1502. For instance, if it is assumed that the dividing circuit 1502 currently outputs the clock signal CS_1, and a frequency (i.e., a first frequency) of the clock signal CS_1 is lower than a frequency (i.e., a second frequency) of the clock signal CS_2, the dividing circuit 1502 outputs the clock signal CS_2 with the higher frequency instead according to the first control parameter. Alternatively, if it is assumed that the dividing circuit 1502 currently outputs the clock signal CS_1, and the frequency of the clock signal CS_1 is higher than the frequency of the clock signal CS_2, the dividing circuit 1502 outputs the clock signal CS_2 with the lower frequency instead according to the second control parameter. In other words, the first control parameter instructs to increase the frequency of the first clock signal up to the frequency of the second clock signal, and the second control parameter instructs to reduce the frequency of the first clock, signal down to the frequency of the second clock signal. For instance, if it is assumed that the dividing circuit 1502 currently outputs the clock signal CS_1 having the frequency of "100 MHz", both the first threshold and the second threshold are "2", and the average of the first iteration count and the third iteration decoding count is "3", the clock controlling circuit 1507 determines that the average of the first iteration count and the third iteration decoding count is over the first threshold and controls the dividing circuit 1502 to output the clock signal CS_2 having the frequency of "133 MHz". Additionally, the average may also be corresponding multi-time iteration decoding procedures, but not limited to the first iteration decoding procedure and the third iteration decoding procedure.

In an exemplary embodiment, the clock controlling circuit 1507 may also include a mean filter (not shown) or an infinite impulse response filter (not shown). By means of inputting the first iteration count into the mean filter or the infinite impulse response filter, the clock controlling circuit 1507 may also generate the corresponding control parameter.

Table 1 is a table showing relation among the clock signals, the average of the iteration counts and the average number of error bits in the codewords according to an exemplary embodiment. If the error bits in N codewords in the former N times of decoding performed by the correcting circuit 1406 tends to be high, the average iteration count of the former N times of decoding performed by the correcting circuit 1406 tends to be high, and the frequency of the clock signal output by the dividing circuit 1502 is correspondingly increased. If the error bits in N codewords in the former N times of decoding performed by the correcting circuit 1406 tends to be low, the average iteration count of the former N times of decoding performed by the correcting circuit 1406 tends to be low, and the frequency of the clock signal output by the dividing circuit 1502 is correspondingly decreased. In other words, whether to increase or to decrease the frequency of the clock signal output by the dividing circuit 1502 may be determined according to the iteration count of each of the former N times of decoding performed by the correcting circuit 1406 or the average of the N iteration counts of the former N times of decoding. In this case, N is preset to "8"; however, in another exemplary embodiment, N may be arbitrary positive integer.

TABLE 1

| Frequency of clock signal (MHz) | average of iteration counts | average of error bits in the codewords (bits) |
| --- | --- | --- |
| 100 | 1 | 12 |
| 100 | 2 | 24 |
| 133 | 3 | 36 |
| 166 | 4 | 45 |
| 200 | 5 | 55 |
| 250 | 6 | 64 |
| 300 | 7 | 73 |
| 333 | 8 | 82 |
| 375 | 9 | 91 |
| 400 | 10 | 100 |

In the present exemplary embodiment, the frequency of the clock signal output by the dividing circuit 1502 is unrelated to frequencies of the clock signals output by the dividing circuits 1503 to 1506. In other words, in the present exemplary embodiment, no matter how the frequency of the clock signal output by the dividing circuit 1502 changes, the dividing circuits 1503 to 1506 output the clock signals having the preset frequencies. However, in another exemplary embodiment, the frequency of the clock signal output by the dividing circuit 1502 may be related to the frequency of the clock signal output by at least one of the dividing circuits 1503 to 1506. It should be noted that the throughput of the memory control circuit unit 104 (or the memory interface 206) is limited, and therefore, the affection to the throughput of the memory control circuit unit 104 (or the memory interface 206) is also limited even though the frequency of the clock signal provided to the correcting circuit 1406 is increased or decreased.

Figure 16:
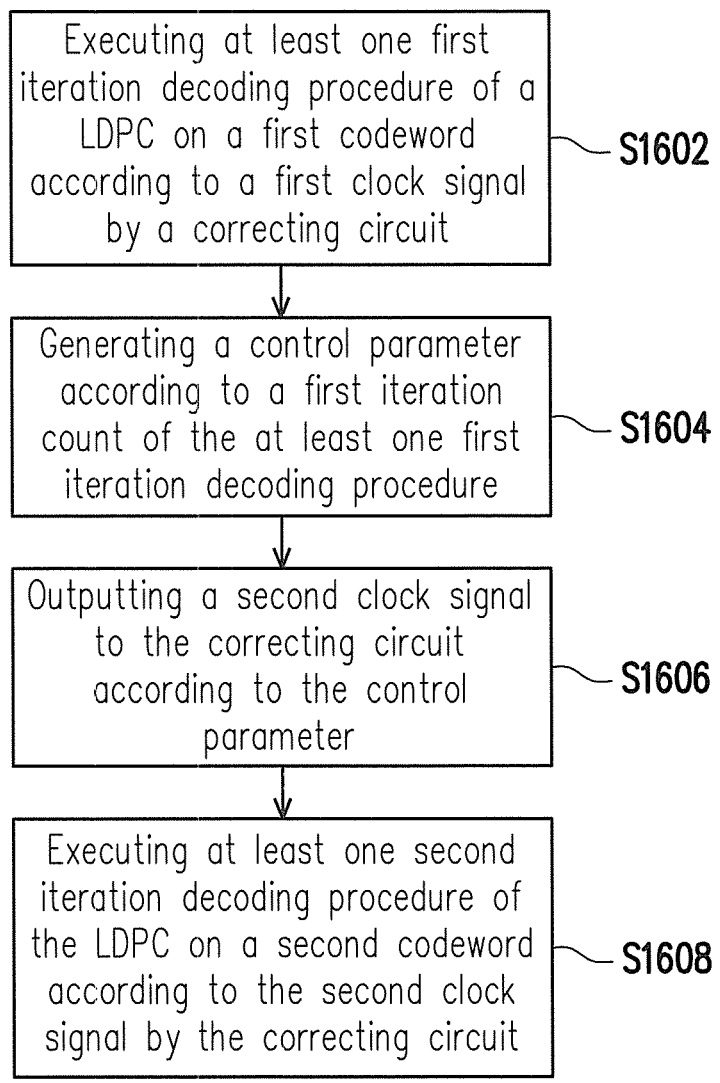
FIG. 16 is a flowchart of a decoding method according to an exemplary embodiment of the present invention.

FIG. 16 is a flowchart of a decoding method according to an exemplary embodiment of the present invention. With reference to FIG. 16, in step S1602, at least one first iteration decoding procedure of the LDPC is executed on a first codeword according to a first clock signal by a correcting circuit. In step S1604, a control parameter is generated according to a first iteration count of the at least one first iteration decoding procedure. In step S1606, a second clock signal is output to the correcting circuit according to the control parameter. In step S1608, at least one second iteration decoding procedure of the LDPC is executed on a second codeword according to the second clock signal by the correcting circuit.

However, each step of FIG. 16 has been described in detail above and will not repeated hereinafter. It should be noted that each of the steps illustrated in FIG. 16 may be implemented as a plurality of program codes or circuits, but construes no limitations to the present invention. Additionally, the method illustrated in FIG. 16 may be implemented together with the exemplary embodiments above or may be performed solely, and the present invention is not limited thereto.

To summarize, in the decoding method, the memory storage device and the memory control circuit unit according to one of the exemplary embodiments of the present invention, the frequency of the current clock signal of the correcting circuit in charge of the iteration decoding can be dynamically adjusted according to the iteration count of the decoding. Thereby, power consumption for decoding can be reduced, and the decoding efficiency can be effectively maintained. Moreover, since the frequency of the current clock signal of the correcting circuit is determined according to historic information, the frequency of the clock signal provided to the correcting circuit can be determined in advance without causing any affection to the current decoding. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method, for a flash memory device, the decoding method comprising:
    executing at least one first iteration decoding procedure of a low density parity code (LDPC) on a first codeword according to a first clock signal by a correcting circuit;
    generating, by a memory control circuit unit, a control parameter for adjusting a first frequency of the first clock signal to a second frequency of a second clock signal according to a first iteration count of the at least one first iteration decoding procedure in order to reduce a power consumption for decoding and maintain a decoding efficiency;
    outputting, by the memory control circuit unit, the second clock signal to the correcting circuit according to the control parameter;
    executing at least one second iteration decoding procedure of the LDPC on a second codeword according to the second clock signal by the correcting circuit;
    outputting, by the memory control circuit unit, another clock signal to an adding circuit for outputting a valid codeword to a host system, wherein the another clock signal inputted to the adding circuit has a preset frequency which is different from the first frequency of the first clock signal or the second frequency of the second clock signal inputted to the correcting circuit for executing the at least one first iteration decoding procedure of the LDPC or the at least one second iteration decoding procedure of the LDPC;
    correcting the second codeword, by the adding circuit, according to the another clock signal and error index information output by the correcting circuit,
    wherein the error index information includes an error bit index, the error bit index is used to correct one or more data bits in the second codeword to generate the valid codeword; and
    outputting, by the adding circuit, the valid codeword to the host system.

2. The decoding method as claimed in claim 1, further comprising:
    executing at least one third iteration decoding procedure of the LDPC on a third codeword according to a third clock signal by the correcting circuit,
    wherein the step of generating the control parameter according to the first iteration count of the at least one first iteration decoding procedure comprises:
        calculating an average of the first iteration count of the at least one first iteration decoding procedure and a third iteration count of the at least one third iteration decoding procedure; and
        generating the control parameter according to the average.

3. The decoding method as claimed in claim 2, wherein the control parameter comprises a first control parameter and a second control parameter, and the step of generating the control parameter according to the average comprises:
    determining whether the average is over a first threshold or lower than a second threshold, wherein the first threshold is equal to or higher than the second threshold;
    if the average is over the first threshold, outputting the first control parameter, wherein the first control parameter is configured to instruct to increase the first frequency of the first clock signal up to the second frequency of the second clock signal; and
    if the average is lower than the second threshold, outputting the second control parameter, wherein the second control parameter is configured to instruct to reduce the first frequency of the first clock signal down to the second frequency of the second clock signal.

4. The decoding method as claimed in claim 1, wherein the step of generating the control parameter according to the first iteration count of the at least one first iteration decoding procedure comprises:
    inputting the first iteration count of the at least one first iteration decoding procedure into a mean filter or an infinite impulse response filter.

5. The decoding method as claimed in claim 1, further comprising:
    outputting a fourth clock signal to a checking circuit; and
    outputting at least one syndrome corresponding to the second codeword according to the fourth clock signal by the checking circuit.

6. A flash memory storage device, comprising:
    a connection interface unit, configured to be coupled to a host system;
    a rewritable non-volatile memory module, comprising a plurality of physical erasing units; and
    a memory control circuit unit, coupled with the connection interface unit and the rewritable non-volatile memory module,
    wherein the memory control circuit unit is configured to control a correcting circuit to execute at least one first iteration decoding procedure of an LDPC on a first codeword according to a first clock signal,
    wherein the memory control circuit unit is further configured to generate a control parameter for adjusting a first frequency of the first clock signal to a second frequency of a second clock signal according to a first iteration count of the at least one first iteration decoding procedure in order to reduce a power consumption for decoding and maintain a decoding efficiency, wherein the memory control circuit unit is further configured to output the second clock signal to the correcting circuit according to the control parameter, wherein the memory control circuit unit is further configured to control the correcting circuit to execute at least one second iteration decoding procedure of the LDPC on a second codeword according to the second clock signal, wherein the memory control circuit unit is configured to output another clock signal to an adding circuit for outputting a valid codeword to the host system and control the adding circuit to correct the second codeword according to the another clock signal and error index information output by the correcting circuit, wherein the another clock signal inputted to the adding circuit has a preset frequency which is different from the first frequency of the first lock signal or the second frequency of the second clock signal inputted to the correcting circuit for executing the at least one first iteration decoding procedure of the LDPC or the at least one second iteration decoding procedure of the LDPC, wherein the error index information includes an error bit index, the error bit index is used to correct one or more data bits in the second codeword to generate the valid codeword, wherein the adding circuit is configured to output the valid codeword to the host system.

7. The memory storage device as claimed in claim 6, wherein the memory control circuit unit is further configured to control the correcting circuit to execute at least one third iteration decoding procedure of the LDPC on a third codeword according to a third clock signal, wherein the operation of the memory control circuit unit generating the control parameter according to the first iteration count of the at least one first iteration decoding procedure comprises:

calculating an average of the first iteration count of the at least one first iteration decoding procedure and a third iteration count of the at least one third iteration decoding procedure; and generating the control parameter according to the average.

8. The memory storage device as claimed in claim 7, wherein the control parameter comprises a first control parameter and a second control parameter, and the operation of the memory control circuit unit generating the control parameter according to the average comprises:

determining whether the average is over a first threshold or lower than a second threshold, wherein the first threshold is equal to or higher than the second threshold;

if the average is over the first threshold, outputting the first control parameter, wherein the first control parameter is configured to instruct to increase the first frequency of the first clock signal up to the second frequency of the second clock signal; and if the average is lower than the second threshold, outputting the second control parameter, wherein the second control parameter is configured to instruct to reduce the first frequency of the first clock signal down to the second frequency of the second clock signal.

9. The memory storage device as claimed in claim 6, wherein the operation of the memory control circuit unit generating the control parameter according to the first iteration count of the at least one first iteration decoding procedure comprises:

inputting the first iteration count of the at least one first iteration decoding procedure into a mean filter or an infinite impulse response filter.

10. The memory storage device as claimed in claim 6, wherein the memory control circuit unit is further configured to output a fourth clock signal to a checking circuit and control the checking circuit to output at least one syndrome corresponding to the second codeword according to the fourth clock signal.

11. A memory control circuit unit, configured to control a rewritable non-volatile memory module comprising a plurality of physical erasing units, the memory control circuit unit comprising:

a host interface, configured to be coupled to a host system;

a memory interface, configured to be coupled to the rewritable non-volatile memory module;

a memory management circuit, coupled with the host interface and the memory interface;

an error checking and correcting circuit, coupled to the memory management circuit, wherein the error checking and correcting circuit comprises a correcting circuit and an adding circuit, and the correcting circuit is configured to execute at least one first iteration decoding procedure of an LDPC on a first codeword according to a first clock signal; and a clock signal output circuit, coupled to the error checking and correcting circuit and configured to output the first clock signal to the correcting circuit, wherein the clock signal output circuit is further configured to generate a control parameter for adjusting a first frequency of the first clock signal to a second frequency of a second clock signal according to a first iteration count of the at least one first iteration decoding procedure in order to reduce a power consumption for decoding and maintain a decoding efficiency, wherein the clock signal output circuit is further configured to output the second clock signal to the correcting circuit according to the control parameter, wherein the correcting circuit is further configured to execute at least one second iteration decoding procedure of the LDPC on a second codeword according to the second clock signal, wherein the clock signal output circuit is further configured to output another clock signal to the adding circuit for outputting a valid codeword to the host system, wherein the another clock signal inputted to the adding circuit has a preset frequency which is different from the first frequency of the first lock signal or the second frequency of the second clock signal inputted to the correcting circuit, wherein the adding circuit is configured to correct the second codeword according to the another clock signal and error index information output by the correcting circuit for executing the at least one first iteration decoding procedure of the LDPC or the at least one second iteration decoding procedure of the LDPC, wherein the error index information includes an error bit index, the error bit index is used to correct one or more data bits in the second codeword to generate the valid codeword, wherein the adding circuit is further configured to output the valid codeword to the host system.

12. The memory control circuit unit as claimed in claim 11, wherein the clock signal output circuit is further configured to output a third clock signal to the correcting circuit, wherein the correcting circuit is further configured to execute at least one third iteration decoding procedure of the LDPC on a third codeword according to the third clock signal, wherein the operation of the clock signal output circuit generating the control parameter according to the first iteration count of the at least one first iteration decoding procedure comprises:

calculating an average of the first iteration count of the at least one first iteration decoding procedure and a third iteration count of the at least one third iteration decoding procedure; and generating the control parameter according to the average.

13. The memory control circuit unit as claimed in claim 12, wherein the control parameter comprises a first control parameter and a second control parameter, and the operation of the clock signal output circuit generating the control parameter according to the average comprises:

determining whether the average is over a first threshold or lower than a second threshold, wherein the first threshold is equal to or higher than the second threshold;

if the average is over the first threshold, outputting the first control parameter, wherein the first control parameter is configured to instruct to increase the first frequency of the first clock signal up to the second frequency of the second clock signal; and if the average is lower than the second threshold, outputting the second control parameter, wherein the second control parameter is configured to instruct to reduce the first frequency of the first clock signal down to the second frequency of the second clock signal.

14. The memory control circuit unit as claimed in claim 11, wherein the operation of the clock signal output circuit generating the control parameter according to the first iteration count of the at least one first iteration decoding procedure comprises:

inputting the first iteration count of the at least one first iteration decoding procedure into a mean filter or an infinite impulse response filter.

15. The memory control circuit unit as claimed in claim 11, wherein the error checking and correcting circuit further comprises a checking circuit, wherein the clock signal output circuit is further configured to output a fourth clock signal to the checking circuit, wherein the checking circuit is configured to output at least one syndrome corresponding to the second codeword according to the fourth clock signal.

* * * * *